US006372391B1

(12) United States Patent
Wolfe et al.

(10) Patent No.: US 6,372,391 B1
(45) Date of Patent: Apr. 16, 2002

(54) TEMPLATE MASK LITHOGRAPHY UTILIZING STRUCTURED BEAM

(75) Inventors: John Charles Wolfe, Houston; Paul Ruchhoeft, The Woodlands, both of TX (US)

(73) Assignee: The University of Houston, Houston, TX (US)

( * ) Notice: Subject to any disclaimer, the term of this patent is extended or adjusted under 35 U.S.C. 154(b) by 17 days.

(21) Appl. No.: 09/669,288

(22) Filed: Sep. 25, 2000

(51) Int. Cl.$^7$ .............................. G03F 9/00; G03C 5/00
(52) U.S. Cl. .......................... 430/5; 430/296; 430/396; 430/942
(58) Field of Search ........................... 430/5, 296, 396, 430/942

(56) References Cited

U.S. PATENT DOCUMENTS 5,611,870 A    3/1997   Horne et al. ................. 136/253

OTHER PUBLICATIONS

Kaesmaier, R. et al. "Overview of the Ion Projection Lithography European MEDEA and International Program" *SPIE Conference on Microlithography* (2000) pp 1–13.
Kaesmaier, R. et al. "Ion Projection Lithography: International Development Program" *J. Vac. Sci. Technol.* vol. B17, No. 6 (1999) pp 3091–3097.
Marrian, C.R.K. et al. "Proximity Correction For Electron Beam Lithography" *Opt. Eng.* vol. 35, No. 9 (1996) pp 2685–2692.
Morgan, M.D. et al. "Application of Optical Filters Fabricated By Masked Ion Beam Lithography" *J. Vac. Sci. Technol.* vol B14, No. 6 (1996) pp 3903–3906.
Koops, H. "Electron Beam Projection Techniques" in *Fine Line Lithography* (ed. Newman, R.) Chpt 3 (1980) pp 233–335.
Owen, G. "Methods For Proximity Effect Correction In Electron Lithography" *J. Vac. Sci. Technol.* vol B8, No. 6 (1990) pp 1889–1890.

*Primary Examiner*—Christopher G. Young
(74) *Attorney, Agent, or Firm*—Ladas & Parry (57) ABSTRACT

For lithographic patterning a plurality of identical structures (24) onto a target substrate (14), a template mask (13) is produced which bears a template structure pattern comprising a plurality of identical template structures each consisting of a set of at least one structure element (C) of circular shape. Starting from a primary mask (11) bearing a primary structure pattern consisting of at least one structure element having a circular shape, the production of the template mask is done in at least one lithographic mask structuring step (b, c) wherein in each mask structuring step by means of a broad beam (31) of energetic radiation the mask is illuminated and a structure pattern on the mask (11,12) is imaged onto an intermediate substrate (12a,13a); in these mask structuring steps the pattern image imaged from the structure pattern is moved over the intermediate substrate to a number of different locations. From the intermediate substrate (12a, 13a) thus patterned another mask (12,13) having a structure pattern corresponding to the pattern image is produced, respectively. The mask produced from the last of said mask structuring steps is the template mask (13). By means of the template mask (13) a target substrate (14) is patterned in a final lithographic patterning step, the pattern image thus produced comprising a plurality of identical target structures (24).

18 Claims, 6 Drawing Sheets

Fig. 1
(state of the art)

TEMPLATE MASK LITHOGRAPHY UTILIZING STRUCTURED BEAM

FIELD OF THE INVENTION AND DESCRIPTION OF PRIOR ART

The invention relates to lithographic patterning of a plurality of identical structures, in particular large areas of periodic nanostructures, onto a target substrate.

One application of periodic nanostructures is the fabrication of near infrared (IR) mesh filter arrays. Photovoltaic energy conversion generally has poor efficiency with thermal—i.e., non-solar—energy sources due to the incongruity between the very broad photo-emission spectrum of thermal radiators with the narrow energy band of photovoltaic conversion. A solution to this problem has been described by Horne et al. in U.S. Pat. No. 5,611,870. In that approach the photovoltaic cell is coupled with an infrared bandpass filter which transmits only those photons that can be efficiently converted to electricity by the photocells and reflects those with either shorter and longer wavelengths back into the source where they are reabsorbed. As infrared bandpass filter a metal-mesh filter array consisting of cross-shaped openings in a thin gold film is used; the cross-shaped openings have a length of 450 nm and an arm width of only 50–80 nm. The use of these filters is expected to increase the efficiency of GaSb photovoltaic cells from less than 1% to near 30% for operation with a 1500 K black-body radiator.

The challenge in forming patterns like the cross-shaped openings of the IR filter array lies in the resolution needed to reproduce the fine corners at the center of the cross. M. D. Morgan et al., in J. Vac. Sci. Technol. B 14 (6), 1996, pp.3903–3906, discuss the fabrication of IR filters using electron-beam lithography (EBL) and ion beam proximity printing (IBP) techniques, which were prepared with equivalent spectral response. The EBL approach uses a finely focused, high-energy beam of electrons to expose resist on a substrate. Deflectors are used to scan the beam across the substrate and so write the desired pattern with high accuracy, but the serial nature of this approach makes the fabrication process extremely time consuming and expensive.

Figure 1:
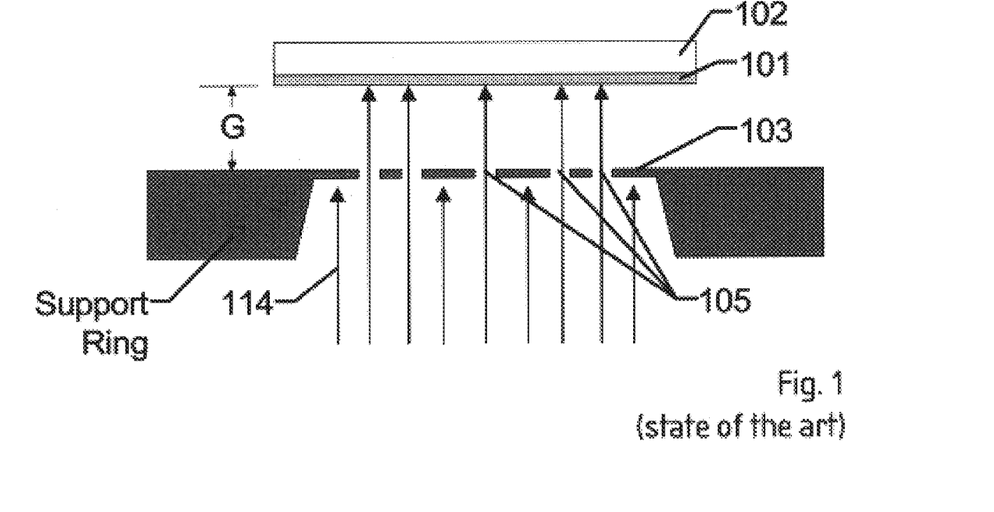
FIG. 1 a schematic representation of the principle of IBP patterning.

FIG. 1 shows the principle of IBP patterning. Sensitive material 101, such as a photo-resist covering a substrate 102 which is to be structured according to the pattern defined in a pattern mask 103, is exposed by transmitted beamlets 104 that are formed when the mask 103 is illuminated by a broad beam 114 of light ions which pass through the transparent regions 105 to expose the underlying resist. In IBP, the mask 103 is positioned in proximity to the substrate 102; the distance G between the mask and the substrate is small, e.g. a few mm or less, and depends on the optical properties of the ion beam system. As illustrated in FIG. 1, the transparent regions 105 are typically openings. The openings of the stencil mask are, for instance, openings corresponding to the desired pattern, and the mask 103 is typically realized as a silicon membrane with etched openings. The parallel printing technique realized with the help of lithography masks replicates the pattern in the mask with a single exposure and so the cost to replicate a mask is effectively independent of array size up to a maximum determined by the size of the beam, which is typically 2 to 8 inches in diameter. Lithographic patterning methods, including printing and projection techniques, as well as lithographic devices using electron or ion beams are discussed, for instance, by H. Koops in 'Electron beam projection techniques', Chapter 3 of 'Fine Line Lithography', Ed. R. Newman, North-Holland, 1980, pp. 264–282. Electrons and in particular ions have the advantage of very low particle wavelengths—far below the nanometer range—which allow of very good imaging properties, as e.g. discussed by Rainer Kaesmaier and Hans Loschner in 'Overview of the Ion Projection Lithography European MEDEA and International Program', Proceedings SPIE, Vol. 3997, Emerging Lithography Technologies IV, 2000. Lithographic patterning using stencil masks is not restricted to particle beam systems, but also possible with lithography systems based on photons, like EUV (Extreme UV) or X-ray lithography. Also instead of transmission masks, reflection masks can be used, in particular in connection with EUV systems; in this case the mask has regions of higher reflectivity in place of transparent regions.

The stencil masks for IR filter arrays are conventionally fabricated using EBL to define the mask structures on a thin silicon membrane substrate. The high cost of the EBL process makes the fabrication of large-area IBP masks—i.e., greater than 1 $cm^2$—uneconomical. To overcome this limitation, one can take advantage of the periodicity of the pattern to print step-and-repeat copies of a small mask onto a second mask substrate to form a second-generation replica with a much larger area. It would be desirable to repeat this replication process to generate subsequently larger generations of the original mask; however, in practice it proves difficult to maintain the fidelity of the original mask structure in even the first copy. This difficulty is due to the inherent blur of an ion beam system. Because of the blur the ion beam system acts as a low-pass spatial filter that attenuates the high-frequency information of a pattern of the original mask when imaged onto the substrate (e.g., a secondary mask).

The blur attenuates the high-frequency information that describes the corners of the original shape to the point where they are significantly rounded. In the case of a cross-shape pattern such as used with an IR filter array, for instance, the center of the structure is enlarged, while the width of the arms varies along their length. Moreover, the rounding of the corners and the widening of the center accumulates over multiple mask generations. Experiments done with 0,49 $cm^2$ stencil masks confirmed that the quality of the mask pattern degrades from first to second generation. Therefore, the reproduction of high-frequency spatial information in multi-generational masks, in particular structures comprising corners and/or elbows of lines, is problematic.

Figure 2:
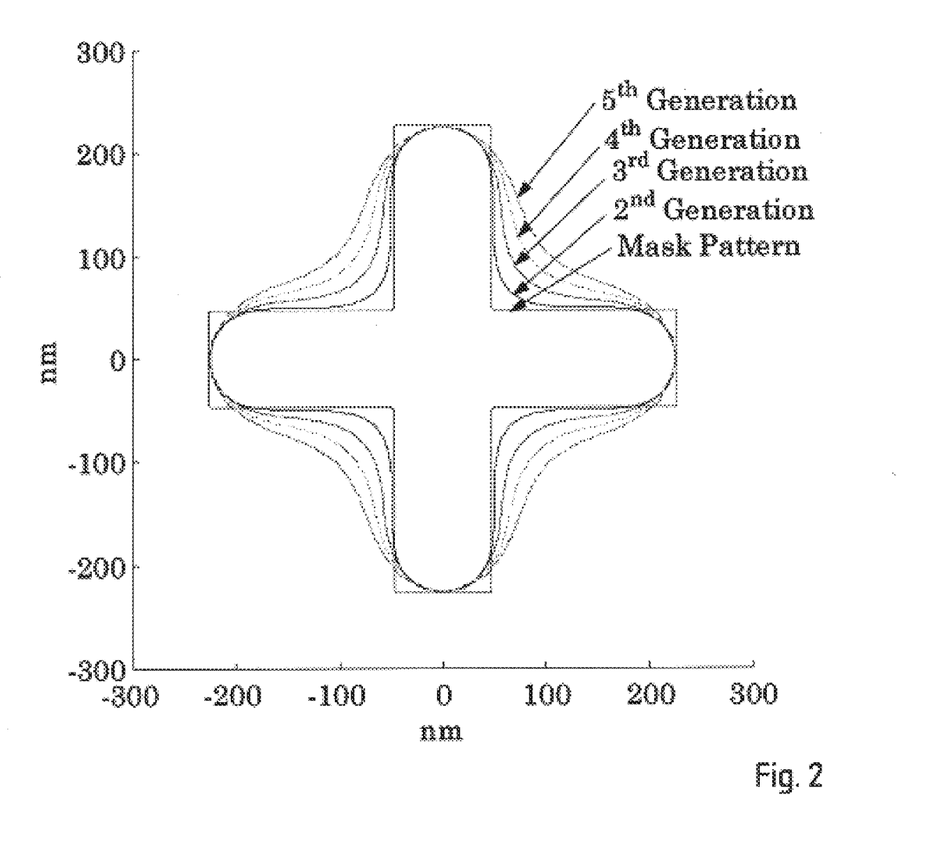
FIG. 2 the degradation of an IBP mask image in a multi-generation imaging process of the state of the art.

The degradation of an IBP mask image is shown in FIG. 2. The graph shows the resist foot-print of five generations of IBP mask copies, where the resist footprint of the previous generation is used as the mask to print the next generation, according to a simulation calculation where the blur was chosen to be 70 nm FWHM. Clearly, the final, fifth generation mask pattern does not resemble the original mask pattern; rather, the initial cross pattern is considerably blotted.

It is an aim of the present invention to overcome the above-described problems with the production of patterns, in particular in the context of multi-generation reproduction of mask patterns.

SUMMARY OF THE INVENTION

This aim is met by a method for lithographic patterning of a plurality of identical structures onto a target substrate wherein, according to the invention, a template mask bearing a template structure pattern, comprising a plurality of identical template structures each consisting of a set of at least one structure element of circular shape, is used for lithographic patterning of the target substrate, wherein by means of a broad beam of energetic radiation the template mask is illuminated to form a structured beam and the template structure pattern is imaged onto the target substrate by means of the structured beam, the target substrate being positioned after the mask as seen in the optical path of the beam and comprising material sensitive to exposure to said energetic radiation, producing a pattern image on the target substrate, the pattern image thus produced comprising a plurality of identical target structures.

A template mask according to the invention, that is, a mask bearing a template structure pattern comprising a plurality of identical template structures each consisting of a set of at least one structure element of circular shape, is suitably produced by a method wherein starting from a primary mask bearing a primary structure pattern consisting of at least one structure element having a circular shape, a template mask bearing a template structure pattern, comprising a plurality of identical template structures each corresponding to the primary structure pattern, is produced using the primary mask to define the template structures, wherein the production of the template mask is done in at least one lithographic mask structuring step wherein in each mask structuring step by means of a broad beam of energetic radiation a mask bearing a structure pattern is illuminated to form a structured beam and the structure pattern is imaged at least once onto an intermediate substrate by means of the structured beam, said intermediate substrate being positioned after the mask as seen in the optical path of the beam and comprising material sensitive to exposure to said energetic radiation, producing a pattern image on the intermediate substrate, and from the intermediate substrate thus patterned another mask having a structure pattern corresponding to the pattern image is produced, the mask used in the first of said mask structuring steps is the primary mask, the mask used in each subsequent step, if present, is the mask produced from the previous step, and the mask produced from the last of said mask structuring steps is the template mask, and in at least one of said mask structuring steps the pattern image imaged from the structure pattern is moved over the intermediate substrate to a number of different locations According to the invention, the generation of the actually desired target structure pattern is deferred until the last step of lithographic patterning. In the preceding steps, namely, the mask structuring steps, only structure patterns consisting of circular apertures are imaged, which are far less problematic to reproduce.

The invention makes possible the accurate reproduction of the primary pattern structure for many generations of subsequent masks. In each generation of mask structuring, the pattern can be multiplied, and thus an enormous number of copies of the initial pattern can be produced. In the final mask which is then used as template mask according to the invention, the desired number of pattern copies is reached; this template mask is then used for patterning of the target substrates. In short, the invention makes it possible to fabricate array mask copies with enormous areas as compared to the initial area of a single target structure; for example, the production of an IR filter of 20×20 cm$^2$ filled with target structures of about 1 $\mu$m size seem achievable with state-of-the-art lithography technology in the short term.

In a preferred embodiment of the invention the final shape of the target structure is defined in the last step of target structuring. In this target patterning step, the pattern image is moved over the substrate through a sequence of image positions, the exposure with respect to the sequence of image positions superposing into a spatial distribution of exposure dose on the substrate, said distribution defining the structures thus patterned on the target substrate according to the exposure-dependent characteristic of said sensitive material.

Preferably, in this case the spatial distribution of exposure dose on the target substrate exceeds the specific minimum exposure dose of said sensitive material only within regions of the substrate field, said regions forming an exposure pattern comprising a plurality of identical structures.

In an advantageous aspect of the invention, the intensity of exposure is varied for each image position in a manner according to a prescribed set of intensities calculated from a representation of a pattern image to be produced on the target substrate. The variation of the exposure intensity of the image positions can be used, e.g., to correct for mutual influence of the effective dose exposure of neighboring structure elements. Preferably, the intensity of exposure may be controlled by varying the time of exposure for the respective image position. In one variant of this aspect, relating to the forming of 3D structures, the pattern image may be defined in terms of a spatial distribution of height of said exposure-sensitive material, and said set of intensities is then suitably calculated from said distribution of height using a predetermined functional dependence of the height on the exposure dose.

Moreover, it is of advantage in this case if the primary structure pattern as well as each of the template structures of the template mask consist of a single structure element of circular shape. Then the circular openings in the mask just define the positions of the target structures to be defined; due to the circular shape of the openings no information due to blurring can be lost during the multiplicative reproduction of the openings.

Suitably, the pattern image is moved through a discrete set of image positions in the target patterning step. This also offers a simple approach to correct for cross-exposure effects between different image positions, wherein the time during which the pattern is held at an image position is varied according to the exposure dose to be imparted to the respective image position.

In a further preferred embodiment of the invention, the energetic radiation comprises electrically charged particles and the lithographic patterning is done using a particle optical lithography system, and the pattern image is moved over the substrate by inclining the direction of the beam with respect to the optical axis of said lithography system by means of an electrostatic deflection means of said lithography system. This makes use of the high accuracy with which the image can be moved over the substrate due to the electrostatic control of the optical apparatus.

Advantageously the energetic radiation in the mask structuring and the target patterning steps comprises electrically charged particles and the lithographic patterning is done using a particle optical lithography system. In particular the energetic radiation may comprise ions, such as hydrogen or helium ions. In this case, it is further suitable if the direction of the beam is inclined by an electrostatic deflection means of the particle optical lithography system.

The invention can be used with a variety of applications, one of which is the patterning of resist layers by energetic radiation. In this case, the target substrate comprises a layer of resist material sensitive to exposure to an energetic radiation. For instance when using ionbeam radiation, there is a host of applications for spatially varying exposure to the ion radiation, such as converting a GaAs substrate into an insulating state by bombardement with, e.g., hydrogen or oxygen ions, doping of semiconductor materials, hardening of material against etching or abrasive attack, or influencing the refractive index by irradiation.

It should be noted that the invention is, of course, not limited to the production of mesh filter arrays. One further application is the production of a stencil mask with a pattern optimized to compensate for blur or, in the case of electrons, proximity effects, based on a template mask according to the invention having a structure pattern comprising at least one circular opening. In this case the target substrate to be patterned is a mask substrate of a mask used in ion beam lithography, such as IBP lithography or ion beam projection lithography.

A lithography system especially suitable for the invention is provided with a template mask as described above, that is, a template mask bearing a template structure pattern comprising a plurality of identical template structures each consisting of a set of at least one structure element of circular shape.

In a further preferred embodiment of the invention, in each mask structuring step, the pattern image is moved over the intermediate substrate to a number of locations arranged in a regular array.

BRIEF DESCRIPTION OF THE DRAWINGS

In the following, the present invention is described in more detail with reference to the drawings, which show.

DETAILED DESCRIPTION OF THE INVENTION

In the following, a preferred embodiment of the invention is presented which relates to the production of IR filter arrays bearing a plurality of identical cross-shaped structures transparent to IR radiation. In the production of these IR filters multi-generation masks are used which in the following are referred to as aperture array masks (AAMs). According to the invention, an array of circular apertures is used as mask pattern in place of the pattern corresponding to the crosses of the IR filter. For, a set of circular apertures forms an example of a mask pattern that contains minimal high-frequency spatial pattern information, and it will always print a set of circular openings, which offers a simple approach for the problem of pattern degradation in multi-generational mask manufacturing. The actual design structure—i.e., a cross-structure having, for instance, 90 nm wide arms having a length of 450 nm, defining a structure of about 1 $\mu$m size—is only defined in the last patterning step when an AAM with a number of apertures corresponding to the desired number of cross-structures is used as template mask for patterning the target substrate, from which the IR filter is produced.

Figure 3:
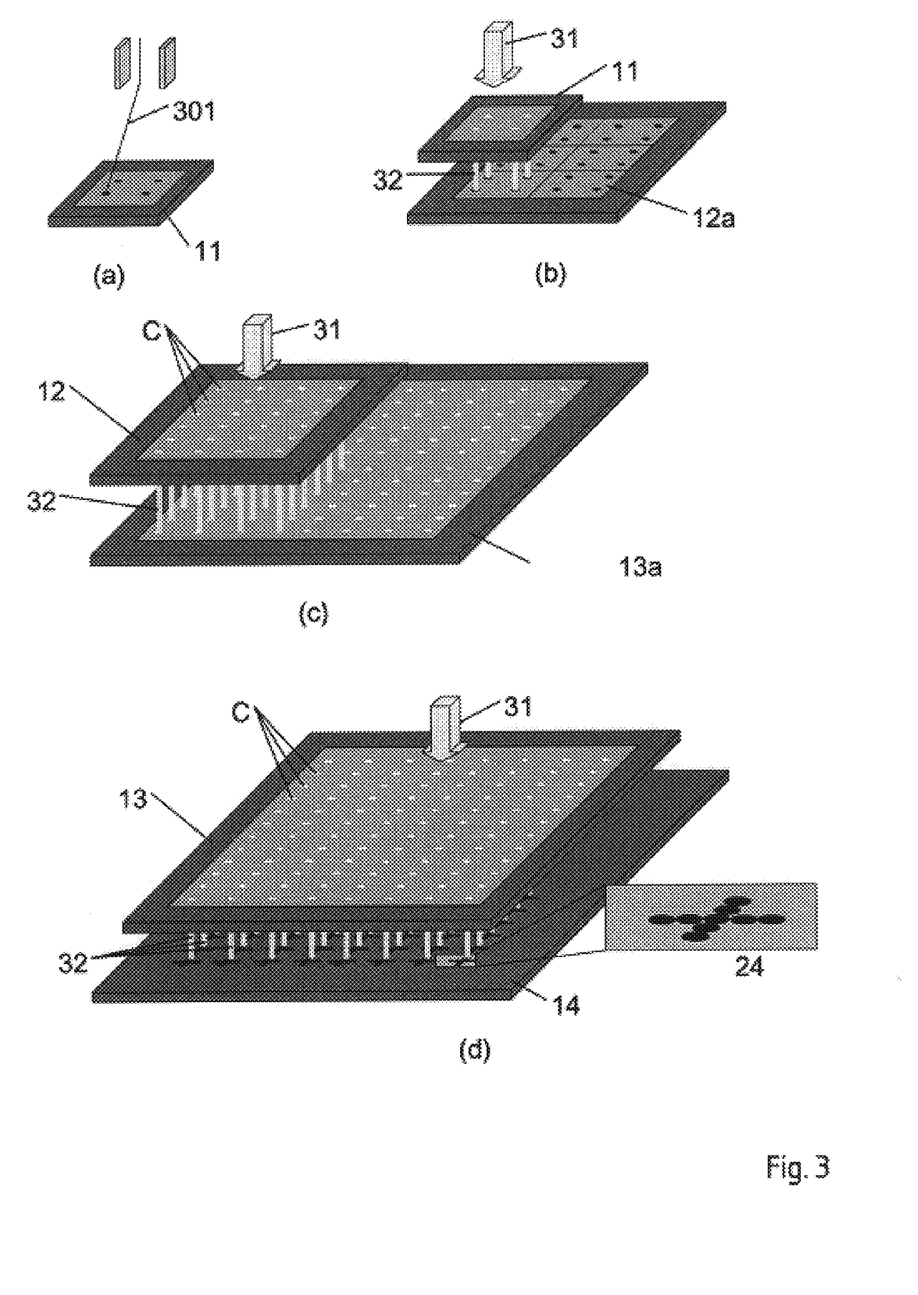
FIG. 3 the multi-generation replication of mask structures according to the invention.

According to the invention, the production of an array with a plurality of openings is done in a multi-generation sequence, as also illustrated in FIG. 3. An initial mask 11 is produced which comprises only a small number of circular openings C, e.g., $n_1$=4 or 16 openings, e.g. by EBL—FIG. 3(a)—wherein the pattern is formed by an electron beam 301 deflected to the regions to be structured on the mask substrate 11. Starting from this initial AAM 11, an AAM is used for patterning of the structure pattern 21 of the next-generation AAM substrate. The final AAM, i.e., the template mask 13, is then used for exposure of the target substrate 14. In each AAM generation, the AAM 11,12 is used to pattern the AAM substrate 12a, 13a of the next generation—FIG. 3 (b) and (c)—, that is, the AAM 11,12 is moved over the substrate 12a,13a of the next-generation AAM to a plurality of positions whose relative positions are arranged according to a predetermined array, e.g., a 2×2, 4×4 or 10×10 square array, or a rectangular 2×3 array as in FIG. 3(b); and then the AAM substrate 12a,13a is developed according to well-known technology in order to produce the AAM 12,13 of the next generation. The replication procedure is repeated until the final AAM consists of a periodic array of apertures whose number correspond to the desired number $n_f$ of structure elements 24 to be produced on the target substrate. It should be noted that the "small number" $n_1$ can actually be quite high depending on the implementation of the invention, but is always well below the number of structures 24 which are to be formed on the target; for instance, $n_1$ might be several millions when the final number $n_f$ is in the order of billions or trillions. In all patterning steps using an AAM—FIG. 3(b) to (d), an IBP method can be used as explained above, where an illuminating broad ion beam 31 is formed in to ion beamlets 32 arranged according to the openings C in the respective AAM 11,12,13.

In the following, the number of positions used in a step to expose the next-generation AAM substrate is referred to as the multiplier $m_p$. (For instance, $m_p$=2×2, 4×4 or 10×10.) In general the multiplier $m_p$ could vary from step to step, although a uniform multiplier simplifies the implementation of the multi-generation production sequence. As becomes clear from the above-said, the number of openings in the final AAM is the product of the number of openings in the initial AAM and the numbers of positions for each of the steps of patterning the next-generation AAM. If, for instance, it is assumed that for all of the k patterning steps a uniform multiplier $m_p$ is used, then the number of openings in the final AAM is $n_f=n_1 \cdot m_p^k$. In the example of FIG. 3, $n_1$=4 and the number of generations k is only 2, with different multipliers for the two patterning steps, $m_p^{(1)}$=2× 3=6 and $m_p^{(2)}$=2×2=4; thus $n_f$=4·6·4=96.

Figure 4:
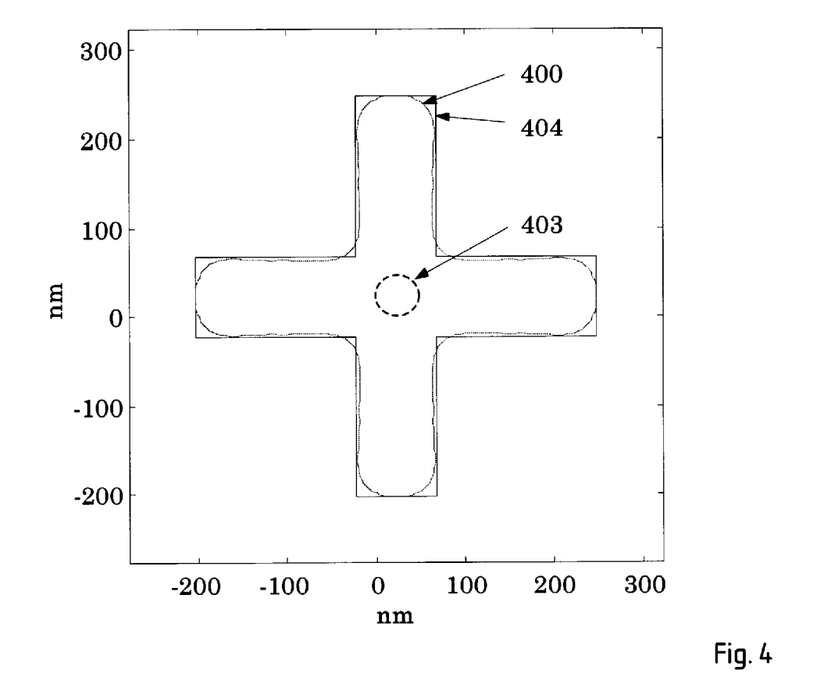
FIG. 4 the pattern generation with a template mask according to the invention.

FIG. 4 illustrates the pattern generation on the target substrate 14 according to the invention with a template mask 13. The advantage of the circular mask pattern is that the shape of the openings remains circular even for many generations. The final template mask can then be used to generate the desired pattern as described below. The graph of FIG. 4 shows the resist footprint for the case where a single dot 403 of 45 nm diameter is used to print an array with 45 nm spacing using the dose distribution calculated as described in detail below. The ideal pattern 400 is a 450 nm long cross with 90 nm wide arms, and a blur of 70 mn FWHM was assumed. In contrary to state-of-the-art multi-generation methods—see FIG. 2—the method according to the invention reproduces the final image 404 regardless of the number of mask generations.

Figure 5:
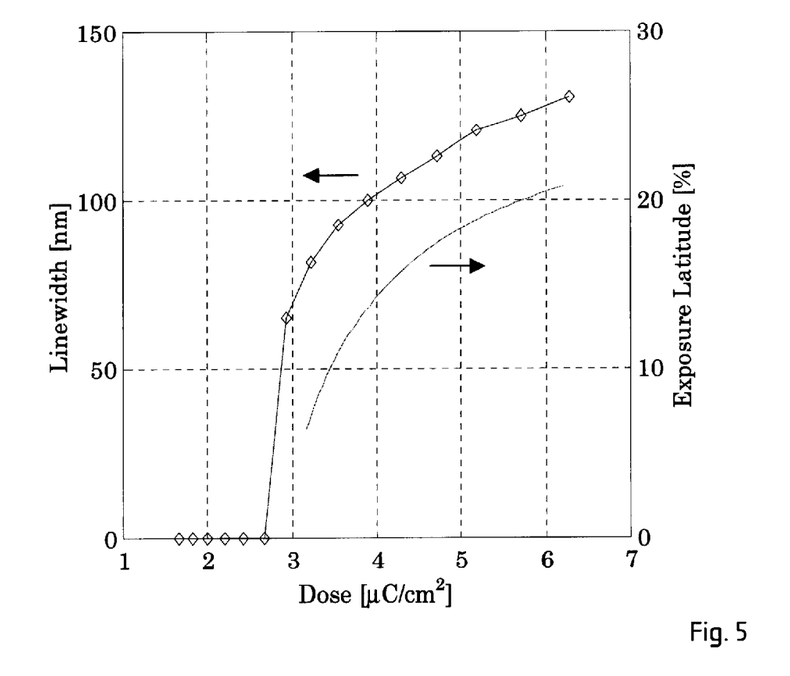
FIG. 5 the dependence of the linewidth and exposure latitude, respectively, upon the exposure dose for circular mask apertures of 90 nm diameter.

One important question with using circular openings for creating multi-generational copies is the control of the diameter of the openings. FIG. 5 shows the dependence of the linewidth and exposure latitude upon the exposure dose for circular mask apertures of 90 mn diameter printed with 75 keV He$^{30}$ ions and 200 nm of PMMA resist. The exposure latitude is defined as the percent change in exposure dose for a 10% change in printed linewidth. The data of FIG. 5 were calculated from a 3D resist exposure and development model as described below. The ion-optical blur (FWHM) was chosen to be 70 nm, the critical dose for the resist was set to 2 $\mu$C/cm$^2$, and the linewidth was measured at 10% from the bottom of the resist. The exposure latitude was calculated from a quadratic fit through the linewidth versus dose data. Even with a blur that is greater than 70% of the printed feature size, the 90 nm apertures can be replicated faithfully with an exposure latitude close to 10%. Since a dose control of 10%—or even 5%—is readily achievable with state-of-the art lithography technology, the size of the hole in the second generation mask should vary by 10% from those in the original. Even in third generation masks, the hole diameter should be within 20% of the original master.

Figure 6:
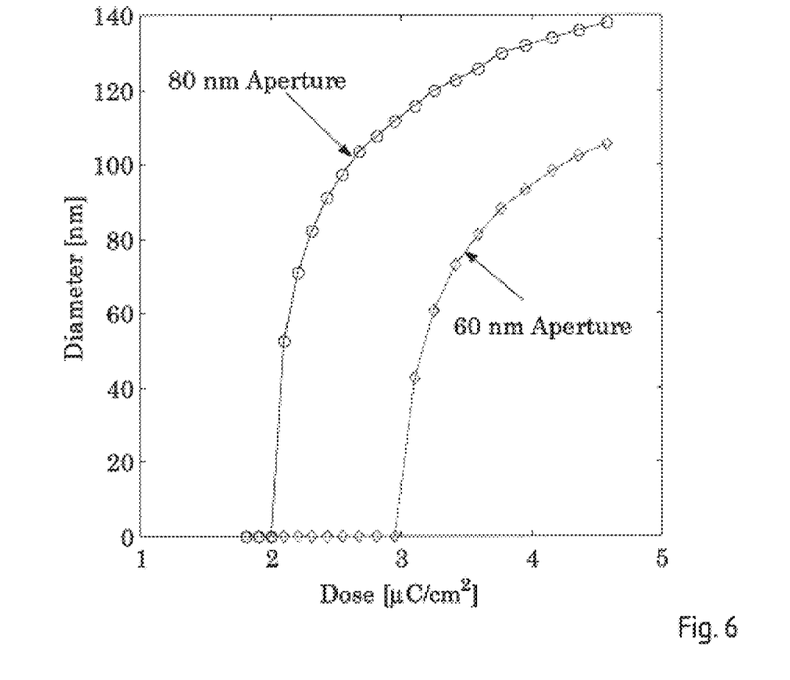
FIG. 6 the dependence of the linewidth upon the exposure dose for circular mask apertures of 80 and 60 nm diameter apertures, respectively.

FIG. 6 shows the dependence of the linewidth on dose characteristics for apertures of 80 nm and 60 nm diameter, respectively, printed with 70 nm FWHM blur under the same conditions as with the 90 nm diameter of FIG. 5 above. The dose at which the smaller aperture is resolved with this large blur is well above the critical dose for resolving the 80 nm apertures.

As can be seen from FIGS. 5 and 6, apertures smaller than a threshold value (which depends on the aperture size) were not resolved at all at this blur setting. Hence, we can conclude that defective openings will be completely lost in the copying process if the blur is chosen to be large. For most applications, this effect is desirable, in particular for the fabrication of IR mesh filter arrays since defective cross structures degrade the bandpass spectrum while missing elements just reduce the peak transmittance of the filter.

Figure 7:
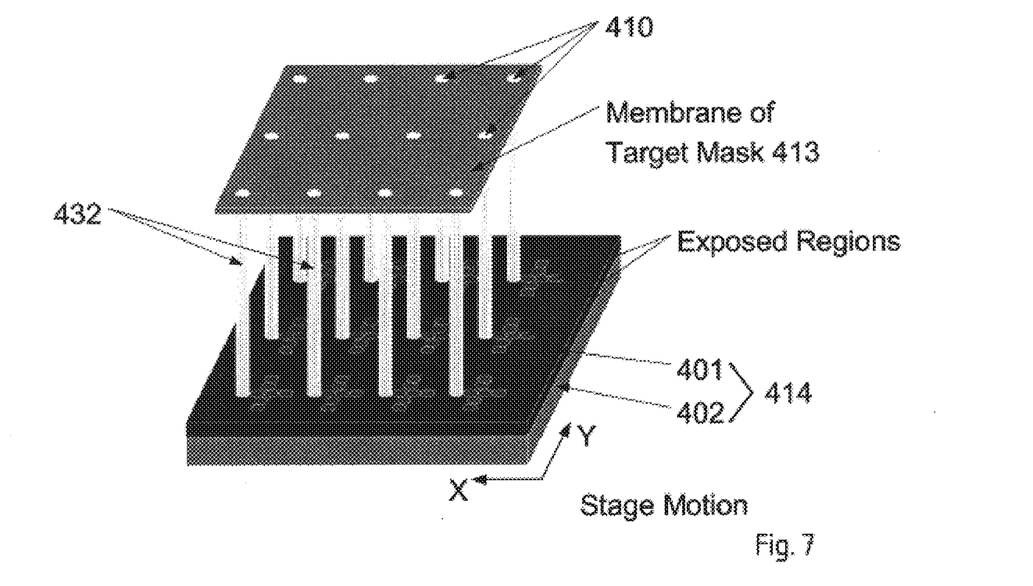
FIG. 7 the exposure of the target substrate with a template mask according to the invention.

According to a preferred variant of the invention—FIG. 7 (corresponding to FIG. 3(*d*))—the final AAM 413 which is used for exposure of the target substrate 414, such as a resistcovered flat or curved semiconductor substrate 402 covered with a resist 401, only comprises a regular array 410 of single circular openings C. During exposure to the ion-beam 31 (FIG. 3(*d*)), the array of circular openings form the illuminating beam into a structured beam consisting of a corresponding set of ion beamlets 432 arranged according to the array 410. The beamlets 432 are scanned in parallel over the substrate 414 to create a periodic array with an arbitrary unit cell, thus realizing a massively parallel lithography (MPL) process. The scanning movement of the beamlets over the substrate is preferably implemented by deflecting the beam 31, e.g., using electrostatic deflector means. Another possible way to realize the scanning movement is to move the substrate 414 by means of the substrate stage which is used to hold and position the substrate with respect to the structured beam in the lithography apparatus.

In the preferred embodiment discussed here, the scanning movement is discrete, wherein the structured beam is moved from position to position and rests at each position for a predetermined time proportional to the exposure dose to be imparted to the substrate. In a variant, the movement is composed of continuous sweeps along lines over substrate.

In the process step of exposure of the target substrate, the features of a single structure patterned on the substrate are sufficiently near to each other so as to mutually affect the effective dose exposure of neighboring structure elements, which leads to well-known distortion of the structure details, in particular where lines end, pass near to each other, or cross each other. To avoid this distortion, it is further proposed to adjust the exposure dose across the unit cell of the printed image in order to overcome blur-related image degradation. It was found that this adjustment, namely, spatial variation of the dose on the substrate as described more in detail below, can dramatically improve the pattern fidelity of the process. The method for calculating the dose adjustment was taken from the proximity effect correction literature, e.g., G. Owen, J. Vac. Sci. Technol. B, 8(6) 1990, pp. 1889–1892.

Figure 8:
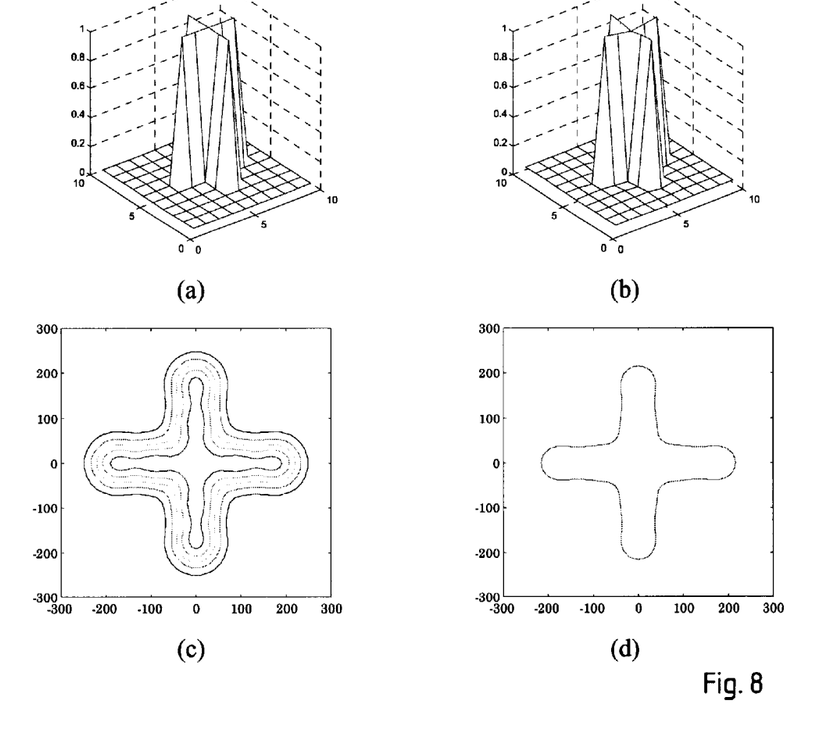
FIG. 8 the effect of dose adjustment for the exposure of the target substrate.

As a starting point for the adjustment of the exposure dose, the substrate surface is divided into, e.g., an n×n rectangular grid of pixels; in the example of FIG. 8, a 10×10 grid is used. The beam then steps over the grid with a variable dwell time and at each grid point position (ij) imparts a dose $D_{ij}$. The complete set of these doses makes up a vector D which is referred to here as the lithography dose distribution vector. Because of cross-effects between the individual grid points, such as blur, the aerial image distribution A is not equivalent to the vector D; rather the aerial image component $A_{ij}$ at a given grid point contains contributions from the exposure at every other point on the grid. The dependence between the vectors D and A can be written as $$A = G \cdot D, \quad (1)$$

with a matrix G containing the cross-effect information for the lithographic system. In this example, G is determined by convolving the lithographic blur function with a unit exposure in each grid element.

In the context of the present invention, the following procedure to calculate an optimum dose D producing a desired aerial image A is proposed, which is simple and fast to calculate as compared to other methods discussed in the literature, such as the method by C. R. K. Marrian, Opt. Eng. 35(9) 1996, pp. 2685–2692.

By setting A to be the desired aerial image, e.g. the an aerial image in the shape of a cross, eq. (1) can be solved for D, i.e., $D = G^{-1} \cdot A$, thus calculating the dose that yields a perfect cross. However, upon solving this equation, it is generally found that unphysical negative doses for the pixels near the edges of the physical pattern result. To overcome this problem, a constant baseline is added to the vector D so as to make all of its element positive and the resulting vector is then normalized by, e.g., division by the value of its largest element. Thus the elements of D lie between 0 and 1. In general, it is necessary also to print outside the area of the desired aerial image A.

FIG. 8 illustrates the above-described procedure for the example of a cross-shaped IR filter element. The cross shape is printed with an aperture pattern consisting of nine dots having 90 nm aperture and a spacing of 90 nm; a 70 nm FWHM blur was assumed. FIG. 8(*a*) shows the desired aerial image A. FIG. 8(*b*) shows the pre-corrected pixel intensities D derived from the inverse of eq.(1) after adding the baseline and scaling the vector elements. The aerial image resulting from the dose distribution of FIG. 8(b) is shown in FIG. 8(c), wherein the contours represent 20%, 30%, 40%, 50% and 60% of the "full" exposure dose; the "full" exposure dose corresponds to the exposure dose obtained on the target when no mask areas blocking off parts of the illuminating beam are present. FIG. 8(d) shows the resulting resist footprint, calculated using the threshold model.

Figure 9:
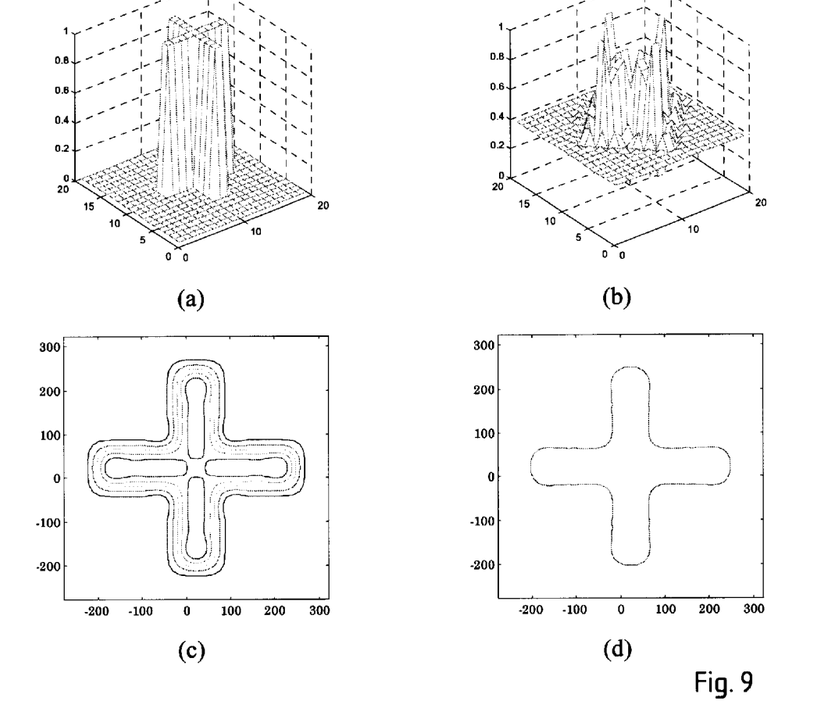
FIG. 9 a variant of FIG. 6 for doubled pixel resolution.

A higher image quality can be achieved by using a mask with smaller dots, as is shown in FIG. 9, where the pattern is divided into 36 pixels according to a grid of 45 nm dots with a spacing of 45 nm—i.e., a doubled resolution as compared to FIG. 8. In other respects, this figure corresponds to FIG. 8; in particular, a 70 nm FWHM blur was assumed as well. As can be seen from FIGS. 9(c) and (d), the definition of the image contour is improved, even though the pixel spacing is well below the blur. On the other hand, now the areas outside the patterned area are exposed to a significant exposure dose. Thus, the drawback of using a pixel size which is smaller than the pixel spacing is a reduction in image contrast which is allowed for if a resist with a sufficient resist contrast is used.

In the preferred embodiment discussed here, the exposure dose is controlled by varying the dwell time of the beam at each position; alternatively, the intensity of the beam can be varied. In the case of a continuous sweep of the beam over the substrate it is also possible to control the exposure dose by appropriate variation of the sweep velocity of the beamlets over the substrate surface; more specifically, the exposure dose at a given point is indirectly proportional to the sweep velocity with which a beamlet is moved over this point.

The time needed for the exposure in the production of the pattern structures on the substrate can be quantified by the ratio of the aperture area and the total pattern area. For instance, a typical IR filter pattern with an arm width of 90 nm and a length of 450 nm has an area of 73,000 nm², while the area of an aperture having a diameter of 90 nm or 50 nm is 6400 nm² or 2000 nm², respectively. Hence, the dose ratio of the pattern to the apertures is 11.5 or 36.5 for the 90 nm dots or 50 nm dots, respectively; this does not include any compensation exposure outside the pattern area. Hence, we expect a significantly lower throughput for the MPL method according to the invention when compared to the IBP mask, where printing is done with a single exposure. However, this is compensated for since the method according to the invention offers the ability to form high-quality, large-area mask replicas of the AAM mask at low cost. Therefore, the total process can be more economical as compared to IBP, even with the longer exposure times. As an example, let us take the case where 100 exposures of a 1 mm² MPL mask are used to create a 1 cm² second-generation membrane. Now the througput is increased by a factor of 10 or 3 for the 90 nm or 45 mn aperture sizes, respectively, when compared to a 1 mm² mask that contains the cross-shaped pattern. Further throughput improvement can be achieved by either fabricating even larger, third or fourth generation AAM masks. An alternative approach would be to use the AAM to pattern a target substrate to form an IBP mask whose shapes have been optimized to reduce the cross exposure effect due to blur. Proximity effect correction methods as mentioned above can again be adapted to compute the desired shape, and throughput would correspond to that of IBP. Clearly, the improved throughput of the MPL mask is most dramatic for very large arrays.

The invention, in particular in connection with the spatial variation of the dose over the substrate, also enables the fabrication of 3D resist structures. In order to form a desired 3D structure which can be described by a height relief function h(x,y), the dose distribution over the substrate is adapted such that only the upper portion of the resist layer is developed so as to leave a resist of the desired thickness. To calculate the dose distribution needed to form the desired 3D structure h(x,y), the exponential model for resist etching is used to calculate the etched depth as a function of exposure dose:

$$z = \tau_o \left(\frac{D}{D_o}\right)^\gamma. \quad (2)$$

Here, $\tau_0$ is the initial resist thickness, D the exposure dose, $D_0$ the dose to clear the resist for large areas and $\gamma$ the resist contrast. By subtracting z from the total resist thickness, the remaining resist thickness is found, which we equate to the desired resist height as a function of position:

$$h(x, y) = \tau_o - z(x, y) = \tau_o\left(1 - \left(\frac{D(x, y)}{D_o}\right)^\gamma\right). \quad (3)$$

This is solved for the spatial dose distribution, which gives an expression for dose in terms of the height function:

$$D(x, y) = D_o\left(1 - \frac{h(x, y)}{\tau_o}\right)^{\frac{1}{\gamma}}, \quad (4)$$

Note that max(h)<$\tau_0$.

In an extension to this method, the effect of non-uniform energy deposition as a function of depth in ion beam lithography can be taken into account using the method described by P. Ruchhoeft and J. C. Wolfe, "Determination of resist exposure parameters in helium ion beam lithography: absorbed energy gradient, contrast, and critical dose," to be published in J. Vac. Sci. Technol. B, 2000.

The above discussion is made under the assumption that the resist is etched in such a way that the etch front proceeds only in the direction normal to the substrate surface; in practice, some error due to lateral etching is expected. The degree of this error is related to the number of steep features in the pattern, and can be neglected on the scale of 50 nm or more for most practical ion energies.

Figure 10:
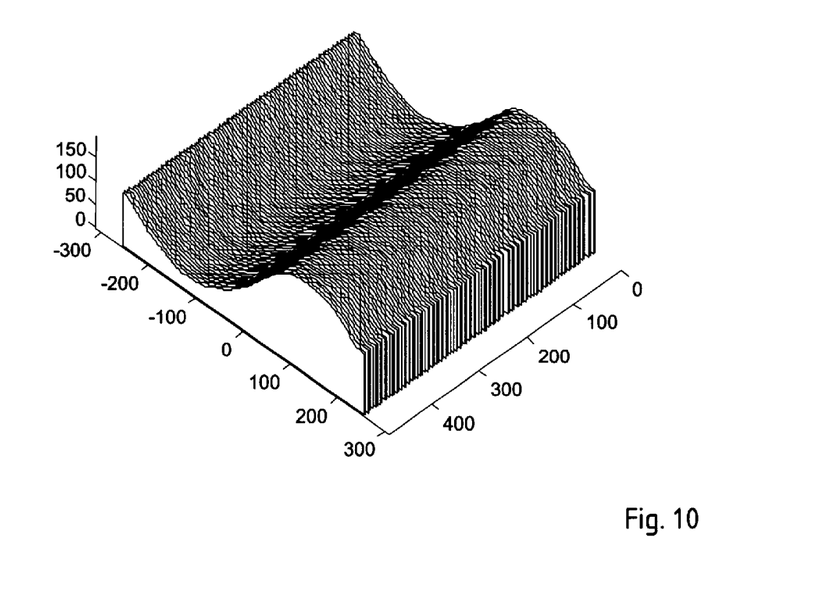
FIGS. 10 and 11 two 3D reliefs produced according to the invention.
Figure 11:
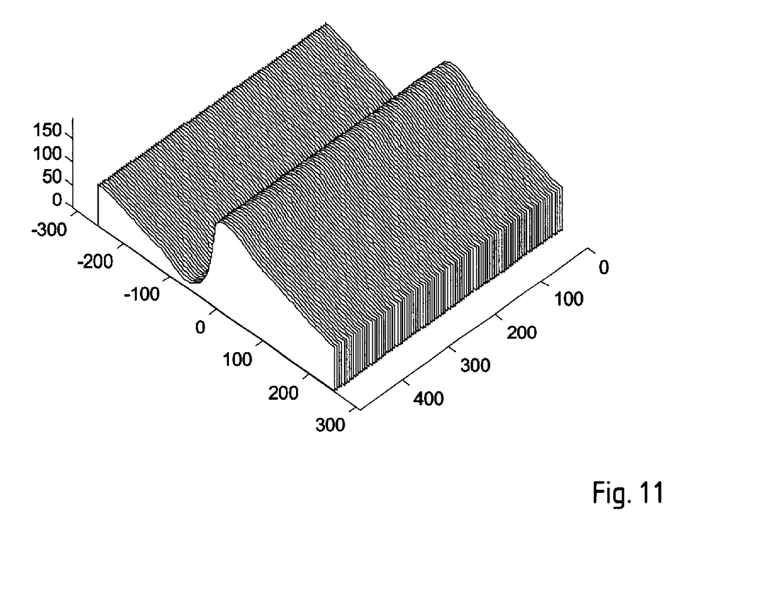

A simulated result of printing two 3D resist structures in a PMMA resist, namely, a sinusoidal and a saw tooth pattern, is shown in FIGS. 10 and 11. The exposure dose was calculated using eq.(4) and the dose was optimized as described for the IR filter pattern earlier. The FWHM blur used for the simulation is 50 nm, the aperture size 90 nm and the step size was chosen to be 45 nm. As before, the ion radiation is 75 keV He⁺; the total starting resist thickness $\tau_0$ was 200 nm. The simulation was performed according to the method as described by R. Kaesmaier etal., J.Vac. Sci. Technol.B, 17(6) 1999, pp.3091–3097, using parameters corresponding to Poly(methyl methacrylate) (PMMA), in particular, a resist contrast $\gamma$=3. Apertures had a spacing of 500 nm (please note that I made a correction in this regard below). The relative dose for each pixel was calculated using equation (4) and then the proximity effect correction technique, summarized by equation (1), was used to calculate the dose distribution.

As can be seen from FIGS. 10 and 11, the quality of the resist structures is very high, even though no further optimization was conducted to either overcome problems with the shape of the resist front or to overcome the energy non-uniformity of the ion exposure. Most notable is the small period of the structure, viz., only 500 nm.

As becomes clear from the above, the invention not only serves as a way to overcome image degradation in large-area, multi-generational mask fabrication. There are a number of additional advantages to this technique, including the ability to overcome system blur through dose correction, the ability to pattern a large area with any arbitrary, periodic pattern, and extendibility of the process to 3D resist structure fabrication.

We claim:

1. A method for lithographic patterning of a plurality of identical structures onto a target substrate, wherein
   a template mask bearing a template structure pattern, comprising a plurality of identical template structures each consisting of a set of at least one structure element of circular shape, is used for lithographic patterning of the target substrate,
   wherein by means of a broad beam of energetic radiation the template mask is illuminated to form a structured beam and the template structure pattern is imaged onto the target substrate by means of the structured beam, the target substrate being positioned after the mask as seen in the optical path of the beam and comprising material sensitive to exposure to said energetic radiation, producing a pattern image on the target substrate, the pattern image thus produced comprising a plurality of identical target structures.

2. The method of claim 1, wherein
   the pattern image is moved over the substrate through a sequence of image positions, the exposure with respect to the sequence of image positions superposing into a spatial distribution of exposure dose on the substrate, said distribution defining the structures thus patterned on the target substrate according to the exposure-dependent characteristic of said sensitive material.

3. The method of claim 2, wherein
   the spatial distribution of exposure dose on the substrate exceeds the specific minimum exposure dose of said sensitive material only within regions of the substrate field, said regions forming an exposure pattern comprising a plurality of identical structures.

4. The method of claim 2, wherein
   the intensity of exposure is varied for each image position in a manner according to a prescribed set of intensities calculated from a representation of a pattern image to be produced on the target substrate.

5. The method of claim 4, wherein
   the intensity of exposure is controlled by varying the time of exposure for the respective image position.

6. The method of claim 4, wherein
   the pattern image is defined in terms of a spatial distribution of height of said exposure sensitive material, and said set of intensities is calculated from said distribution of height using a predetermined functional dependence of the height on the exposure dose.

7. The method of claim 2, wherein
   the primary structure pattern as well as each of the template structures of the template mask consist of a single structure element of circular shape.

8. The method of claim 2, wherein
   the pattern image is moved through a discrete set of image positions.

9. The method of claim 8, wherein
   the time during which the pattern is held at an image position is varied according to the exposure dose to be imparted to the respective image position.

10. The method of claim 2,
    the energetic radiation comprises electrically charged particles and the lithographic patterning is done using a particle optical lithography system, and the pattern image is moved over the substrate by inclining the direction of the beam with respect to the optical axis of said lithography system by means of an electrostatic deflection means of said lithography system.

11. The method of claim 1, wherein
    the energetic radiation comprises electrically charged particles and the lithographic patterning is done using a particle optical lithography system.

12. The method of claim 11, wherein
    the energetic radiation comprises ions, such as hydrogen or helium ions.

13. The method of claim 1, wherein
    the target substrate comprises a layer of resist material sensitive to exposure to an energetic radiation.

14. A lithography system provided with a template mask according to claim 1, the template mask bearing a template structure pattern comprising a plurality of identical template structures each consisting of a set of at least one structure element of circular shape.

15. A method for producing a template mask according to claim 1, the template mask bearing a template structure pattern comprising a plurality of identical template structures each consisting of a set of at least one structure element of circular shape, wherein starting from a primary mask bearing a primary structure pattern consisting of at least one structure element having a circular shape, a template mask bearing a template structure pattern, comprising a plurality of identical template structures each corresponding to the primary structure pattern, is produced using the primary mask to define the template structures, wherein
    the production of the template mask is done in at least one lithographic mask structuring step wherein in each mask structuring step by means of a broad beam of energetic radiation a mask bearing a structure pattern is illuminated to form a structured beam and the structure pattern is imaged at least once onto an intermediate substrate by means of the structured beam, said intermediate substrate being positioned after the mask as seen in the optical path of the beam and comprising material sensitive to exposure to said energetic radiation, producing a pattern image on the intermediate substrate, and from the intermediate substrate thus patterned another mask having a structure pattern corresponding to the pattern image is produced,
    the mask used in the first of said mask structuring steps is the primary mask, the mask used in each subsequent step, if present, is the mask produced from the previous step, and the mask produced from the last of said mask structuring steps is the template mask, and
    in at least one of said mask structuring steps the pattern image imaged from the structure pattern is moved over the intermediate substrate to a number of different locations.

16. The method of claim 15, wherein
    in each mask structuring step, the pattern image is moved over the intermediate substrate to a number of locations arranged in a regular array.

17. The method of claim 15, wherein
    the energetic radiation comprises electrically charged particles and the lithographic patterning is done using a particle optical lithography system.

18. The method of claim 17, wherein
    the energetic radiation comprises ions, such as hydrogen or helium ions.

* * * * *